(12) United States Patent
Jansen et al.

(10) Patent No.: US 7,911,293 B2
(45) Date of Patent: Mar. 22, 2011

(54) THERMOMETER CODED ATTENUATOR

(75) Inventors: Douglas S. Jansen, Pelham, NH (US);
Gregory M. Flewelling, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 76 days.

(21) Appl. No.: 12/492,689

(22) Filed: Jun. 26, 2009

(65) Prior Publication Data
US 2010/0327998 A1    Dec. 30, 2010

(51) Int. Cl.
*H03G 3/20* (2006.01)
(52) U.S. Cl. ...................................... 333/81 R; 327/308
(58) Field of Classification Search ............... 333/81 A, 333/81 R, 17.2, 28 R; 327/308, 309; 375/229, 375/230, 232, 233
See application file for complete search history.

(56) References Cited

U.S. PATENT DOCUMENTS

| | | | |
|---|---|---|---|
| 4,412,183 A | 10/1983 | Brodie | |
| 5,523,712 A | 6/1996 | Miyabe et al. | |
| 5,880,618 A | 3/1999 | Koen | |
| 6,229,375 B1 | 5/2001 | Koen | |
| 7,253,700 B1 | 8/2007 | Chiu | |
| 7,542,812 B2 | 6/2009 | Stroili et al. | |
| 7,746,969 B2 * | 6/2010 | Bryan et al. | .................. 375/349 |
| 2008/0272946 A1 | 11/2008 | Melanson | |
| 2009/0040086 A1 | 2/2009 | Hong et al. | |
| 2009/0072931 A1 | 3/2009 | Chiu | |

OTHER PUBLICATIONS

Beaulieu, "12-bit Digital to Analog Converter".
"MiniCircuits Digital Step Attenuators Offer Precision and Linearity" (AN-70-004), Nov. 5, 2007.
Kantasuwan et al, "Programmable RF Attenuator for On-Chip Loopback Test".
Radulov et al, "A Binary-To-Thermometer Decoder with Redundant Switching Sequences".
PCT Search Report and Written Opinion, PCT/US2010/038745, mailed Aug. 18, 2010.

* cited by examiner

*Primary Examiner* — Stephen E Jones
(74) *Attorney, Agent, or Firm* — Finch & Maloney PLLC; Neil F. Maloney

(57) ABSTRACT

Techniques are disclosed that allow for programmable attenuation using thermometer code steps. By thermometer coding the attenuator structure, monotonicity is guaranteed or otherwise greatly improved, which eliminates instability problems with automatic gain control loops and without the need for compensation or trimming. In addition, the thermometer coding technique also greatly reduces phase discontinuity between adjacent gain states.

7 Claims, 3 Drawing Sheets

THERMOMETER CODED ATTENUATOR

FIELD OF THE INVENTION

The invention relates to attenuators, and more particularly, to a thermometer coded attenuator structure.

BACKGROUND OF THE INVENTION

As is known, an attenuator circuit reduces the power of a signal without distorting or changing other signal parameters (e.g., frequency, waveform shape, etc). As such, attenuators are commonly used for amplitude or gain control in high-frequency applications. Typical attenuator styles include fixed-value attenuators (sometimes referred to as pads), continuously variable attenuators, and digitally programmable attenuators (sometimes referred to as digital attenuators).

Unlike fixed-value and continuously variable attenuators, digital attenuators respond to a control signal by switching in discrete, finite attenuation steps (hence, digital attenuator). The control signal is generally provided by the control logic and driver circuitry, which in turn controls the attenuator structure to provide the desired level of attenuation. The control logic and driver circuitry can vary, for example, depending on factors such as the desired complexity, control speed, and specifics of the target application (e.g., room available for attenuator and cost constraints).

Digital attenuators are generally specified by the number of bits of attenuation (e.g., such as a 10-bit attenuator), wherein each bit corresponds to a step of attenuation. The least-significant bit (LSB) selects the smallest single step of attenuation that can be provided by the attenuator and the most-significant bit (MSB) selects the single largest step of attenuation, with the attenuation steps in between these two extremes selected by combinations including the remaining bits. When only the LSB is selected, the attenuator provides its minimum attenuation step, and when all the bits are selected, a digital attenuator provides its maximum attenuation step.

Typical attenuator designs employ a binary weighted switching scheme that operates in conjunction with a network of progressively increasing resistance values (generally referred to as a resistive ladder or 'R-2R' network). In particular, when only the LSB is selected, only the smallest resistance value is switched in to set the signal path gain to provide the minimum attenuation step. Likewise, when all the bits are selected, all the resistance values are switched in to set the signal path gain to provide the maximum attenuation step.

There are a number of problems associated with such binary (or other) weighted switching schemes to control signal path gain in conventional attenuator designs, including poor monotonicity and phase discontinuity. There is a need, therefore, for better attenuator designs.

SUMMARY OF THE INVENTION

One embodiment of the present invention provides a method for attenuating a signal using a thermometer coded attenuator device having a number of attenuator steps. The method includes applying a control code to a thermometer coded attenuator network to provide a desired attenuation step. The thermometer coded attenuator network has an input port and an output port and a plurality of impedance elements, and each impedance element is operatively coupled between the input and output ports and in parallel with one another. The method continues with attenuating an analog signal using the thermometer coded attenuator network, and maintaining a constant signal delay for each available attenuation step. The method may include the preliminary steps of receiving an attenuator control code having a first form (e.g., binary attenuator control code), and converting that attenuator control code to a second control code (e.g., thermometer control code), wherein the second control code is applied to thermometer coded attenuator network to provide a desired attenuation step. Note, however, that the thermometer coded attenuator network can be controlled by other control codes, and is not limited to thermometer control codes. In one particular case, the thermometer coded attenuator device has a frequency band of interest, and the thermometer coded attenuator network has a low impedance node that forms a pole that is outside the frequency band of interest. The method can be carried out, for instance, by a system-on-chip, although numerous other configurations will be apparent in light of this disclosure. In another particular case, the constant signal delay for each available attenuation step is such that variance in signal delay across all attenuation steps is 5% or less.

Another embodiment of the present invention provides a device for attenuating a signal. The device includes a thermometer coded attenuator network for providing a desired attenuation step responsive to a control code. The thermometer coded attenuator network has an input port and an output port and a plurality of impedance elements, and each impedance element is operatively coupled between the input and output ports and in parallel with one another. The system further includes an amplifier for attenuating an analog signal using the thermometer coded attenuator network. The device maintains a constant delay through the thermometer coded attenuator network for each available attenuation step. The device may include a code converter for receiving an attenuator control code having a first form (e.g., binary attenuator control code), and for converting that attenuator control code to a second control code (e.g., thermometer control code, or other suitable code), wherein the second control code is applied to the thermometer coded attenuator network to provide a desired attenuation step. In one particular case, the thermometer coded attenuator device has a frequency band of interest, and the thermometer coded attenuator network has a low impedance node that forms a pole that is outside the frequency band of interest. The constant signal delay for each available attenuation step can be such that variance in signal delay across all attenuation steps is, for instance, 5% or less in some cases, or 2% or less in other cases. The device can be included, for example, in a system-on-chip configuration that calls for attenuation.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
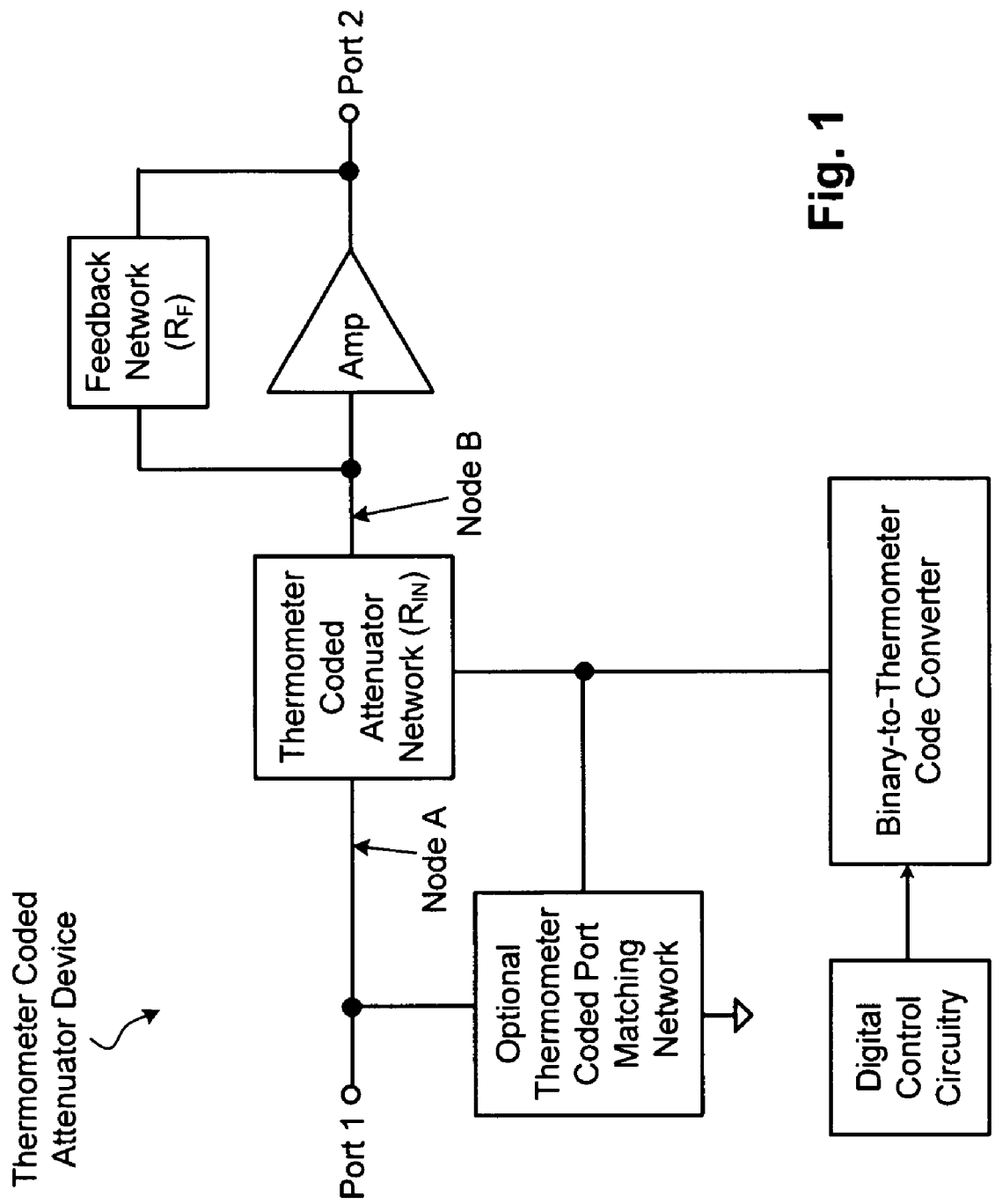
FIG. 1 is a block diagram of a thermometer coded attenuator device, configured in accordance with one embodiment of the present invention.

Programmable attenuator techniques and devices are disclosed. The techniques enable improved monotonicity and eliminate or otherwise decrease phase discontinuity, relative to conventional attenuator designs.

General Overview

As previously explained, conventional attenuator designs use binary (or other) weighted switching schemes to control signal path gain. There are a number of problems associated with such conventional designs, including poor monotonicity and phase discontinuity.

In more detail, when binary weighted switching is used in an attenuator structure, the signal path delay becomes a function of gain state. This causes large variations in signal phase between adjacent gain states, which is unacceptable for many applications. Traditionally, a laser trimming procedure (or other suitable fine tuning process) is used to reduce discontinuities. However, such ad hoc adjustments are not feasible with high-volume monolithic integration (e.g., system-on-chip applications that employ programmable attenuation).

Additionally, binary weighting does not guarantee monotonicity. This means some gain states may increase in value, while the digital attenuation command was intended to decrease gain, and vice-versa. This inconsistency generally causes instability in gain control loops. Again, circuit trimming techniques can be used to improve monotonicity, but such a corrective solution effectively requires customization of each device and is not amenable to low cost volume production.

Thus, in accordance with an embodiment of the present invention, a programmable attenuator structure is configured to decode binary weighted steps into thermometer code weighted steps. By thermometer coding the attenuator structure, monotonicity is guaranteed or otherwise greatly improved, which eliminates instability problems with automatic gain control loops and without the need for compensation or trimming. In addition, the thermometer coding technique described herein also greatly reduces phase discontinuity between adjacent gain states.

Example applications in which the techniques may be applied include, for instance, automatic-gain-control (AGC) circuits and variable-gain amplifier (VGA) circuits. Many communication waveforms and applications (e.g., such as direction finding) require an attenuation scheme having a continuous phase versus gain state transfer function. The techniques provided herein enable such an attenuation scheme, but without the need for elaborate off-chip trimming approaches, and further enable high-volume monolithic integration.

A thermometer coded attenuator structure as described herein may be included in any number of system configurations, whether that system includes various discrete components operatively coupled to one another via conductive runs and/or cabling (e.g., multiple components on one or more printed circuit boards, including an attenuator structure configured in accordance with an embodiment of the present invention), or a system-on-chip (SOC) configuration wherein multiple electronic functions and circuit types are integrated onto a signal die or chip set. Numerous applications will be apparent in light of this disclosure.

Attenuator Architecture

FIG. 1 is a block diagram of a thermometer coded attenuator device, configured in accordance with one embodiment of the present invention. The device can be used in any number of applications requiring attenuation (e.g., SOC for communications or direction finding/geolocation), and is particularly suitable for those applications calling for monotonicity and phase continuity.

As can be seen, the thermometer coded attenuator device includes a thermometer coded attenuator network ($R_{IN}$) that is operatively coupled to an amplifier (Amp) having a feedback network ($R_F$). The gain factor of the attenuator signal path is determined by $R_F/R_{IN}$. In this example, the attenuator gain is programmable in that the value of $R_{IN}$ can be adjusted based on the output of the binary-to-thermometer code converter, which is in turn coupled to digital control circuitry. An optional thermometer coded port matching network may be provided as well, which can also be controlled by the binary-to-thermometer code converter output. In any case, signals applied to the input port of the attenuator device (Port 1) can be selectively attenuated based on the programmable gain/attenuation factor $R_F/R_{IN}$, with the resulting attenuated signal being provided at the output port of the attenuator device (Port 2).

The amplifier can be implemented with any suitable amplifier circuit (e.g., conventional op-amp circuitry or customized design). The amplifier can be selected or otherwise designed so as to provide performance parameters suitable for the target application, including power rating, frequency band of operation, slew rate, input offset voltage, and input impedance. Any number of amplifier designs can be used here, and the present invention is not intended to be limited to any particular amplifier design. So long as the amplifier can be configured as an attenuator that is programmable using a thermometer coded network as described herein.

The feedback network can be, for example, a resistor having a fixed value suitable for providing the desired $R_F$. Other feedback network configurations can be used as well, such as those including filtering and/or integration capability, with such additional feedback network functionality depending on the target application. The thermometer coded attenuator network employs a thermometer coded resistor array to provide a programmable $R_{IN}$. Other thermometer coded attenuator network configurations can be used as well, such as those including filtering capability, with such additional input network functionality depending on the target application. Further details of the thermometer coded attenuator network will be provided with reference to FIGS. 2 and 3. A number of variations and attenuator programming schemes will be apparent in light of this disclosure. For example, in one alternative embodiment, the attenuator gain factor can be adjusted by adjusting the value of $R_F$ (e.g., thermometer coded feedback network) based on the output of the binary-to-thermometer code converter. Still in other embodiments, the attenuator gain factor can be adjusted by selectively adjusting both the values of $R_F$ and $R_{IN}$ (e.g., thermometer coded input and feedback networks) based on the output of the binary-to-thermometer code converter.

In any such cases, note that the signal path flows through the thermometer coded attenuator network, which is distinct from a conventional attenuator network (e.g., R-2R resistive ladder) that is merely controlled by a thermometer code (or other control code, such as binary). A thermometer coded attenuator network has inherently lower phase discontinuity between gain states than a conventional R-2R resistive ladder network primarily because the signal path length of the attenuator structure does not change. In more detail, a thermometer coded attenuator structure uses parallel circuitry. As such, all signals must pass through or otherwise connect to the same two points, node A and node B. In contrast, a conventional R-2R resistive ladder attenuator structure is serial in nature. Thus, there are many intermediate points along the signal path that get selected or bypassed. This has the effect of changing the net delay of the signal, which equates to phase. Many communication waveforms cannot tolerate large phase discontinuities, for example, when the gain is tuned to match a time varying signal (e.g., data gets corrupted and must be resent, effectively slowing down the data rate).

Another distinction between a thermometer coded attenuator structure and a conventional R-2R resistive ladder attenuator structure has to do with the circuit topology, in that a thermometer coded structure as described herein effectively drives a very low input impedance node of the amplifier (node B). Low impedance as used here refers to the attenuator network, not the input impedance of the operational amplifier, which is very high. This low impedance node of the attenuator network forms a pole that is very high in frequency, relative to the frequency band of interest. Thus, although this high frequency pole moves around while changing the thermometer coded resistor array, it is far from the spectrum of interest and has no phase impact on in-band signals. In contrast, an R-2R ladder network again has intermediate points that are resistively loaded (not low impedance). As such, even if the path delay differences could be minimized, there still remains the problem of a pole moving around that is in, or otherwise close to being, in-band, thereby causing large phase discontinuities.

The digital control circuitry, which can be implemented with conventional technology, is configured to provide a binary code that corresponds to the desired level of attenuation to be provided. The number of bits of the binary code will depend on factors such as the desired number of attenuation steps. Although this example employs a digital circuitry to provide a binary code, any number of suitable control circuits can be used, as will be apparent in light of this disclosure (e.g., binary, thermometer, analog, and manual control circuits).

The binary-to-thermometer code converter, which can also be implemented with conventional technology, operates to convert the binary control signal (output by the digital control circuitry) into a thermometer code. The thermometer code is then applied to the thermometer coded attenuator network (as well as the thermometer code port matching network, if applicable). As is known, while a binary code includes weighted bits and provides a degree of efficiency (e.g., a 3-bit binary code allows for up to 7 distinct codes), the bits of a thermometer code all have the same weight (e.g., a 3-bit binary code translates to a 7-bit thermometer code). In alternative embodiments, the code converter can be adapted to convert whatever code type is provided by the control circuitry into a thermometer code. In other embodiments, the control circuitry can be configured to provide a thermometer code, thereby eliminating the need for the code converter circuitry. Recall, however, that employing a thermometer code for control does not necessitate or even imply a thermometer coded attenuator network. In addition, a thermometer coded attenuator network does not require a thermometer code to be controlled. Rather, the thermometer coded attenuator network as provided herein can be controlled by any number of suitable control code signal types (binary, thermometer, or analog), so long as that control signal correctly sets the thermometer coded attenuator network.

The optional thermometer coded port matching network can be used to provide a better impedance match at port 1, with respect to the output impedance of the source circuitry and $R_{IN}$. As is known, such impedance matching can be used to improve input return loss. In this example embodiment, the output of the binary-to-thermometer code converter can be used to adjust the matching network in conjunction with adjusting the thermometer coded attenuator network value, $R_{IN}$.

As will be appreciated in light of this disclosure, the impedance at nodes A and B are related to a ratio between the lowest impedance of the thermometer coded attenuator network (e.g., when all switching devices are switched on simultaneously) and the impedances of the nodes driving and loading the thermometer coded attenuator network. Generally, the lower the impedances driving/loading ports 1 and 2 relative to the thermometer coded attenuator network, the better the phase performance and the wider the bandwidth that can be achieved. In some embodiments, the driving/loading impedances are less than minimum impedance of the thermometer coded attenuator network, but this is not absolutely necessary. In one specific example case, there is about a 10:1 (network to ports) impedance ratio, or about 45 ohms to about 5 ohms. Higher impedance ratios (e.g., 100:10, 1000:100, etc) can be used, depending on the frequency of interest. In a more general sense, the impedance at nodes A and B can be as high as desired, so long as the attenuator functions for its intended purpose.

Figure 2:
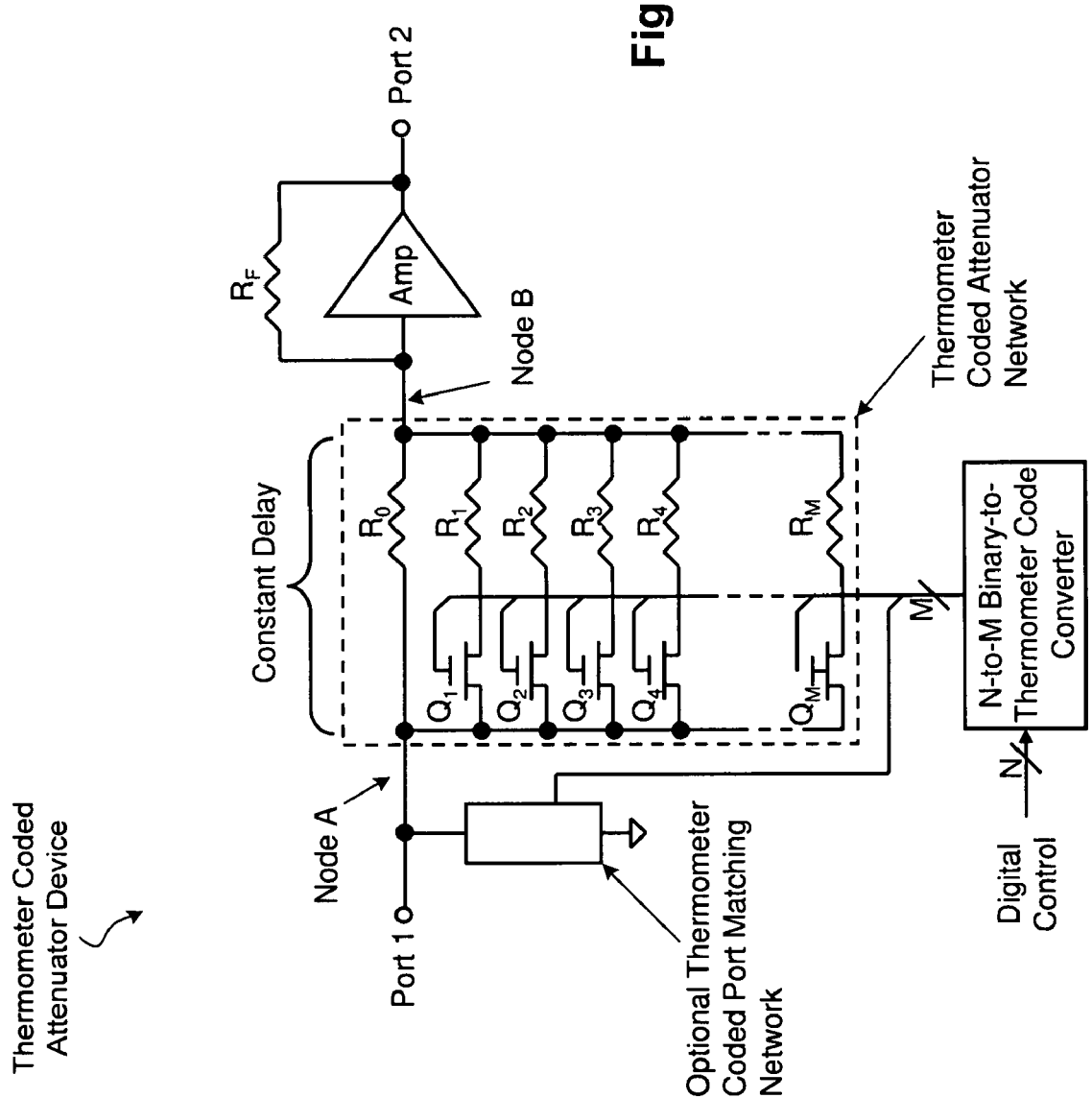
FIG. 2 is a schematic diagram of a thermometer coded attenuator device, configured in accordance with one embodiment of the present invention.

FIG. 2 is a schematic diagram of a thermometer coded attenuator device, configured in accordance with one embodiment of the present invention. As can be seen, the thermometer coded attenuator device of this example embodiment includes a thermometer coded attenuator network that is operatively coupled to the input of an amplifier (Amp) having a fixed feedback network ($R_F$). The gain factor of the attenuator signal path is determined by $R_F/R_{eff}$, wherein $R_{eff}$ is the effective resistance of the thermometer coded attenuator network after it has been programmed to provide a desired attenuation step.

In this specific example, the attenuator gain is programmable in that the value of $R_{eff}$ can be adjusted based on the output of the N-to-M binary-to-thermometer code converter (e.g., where N is the number of binary bits and M is the number of thermometer code bits, such as a 4-to-15 binary-to-thermometer code converter). The previous disclosure with reference to FIG. 1, relative to the thermometer coded attenuator network, amplifier, fixed feedback network ($R_F$), binary-to-thermometer code converter, and optional thermometer coded port matching network is equally applicable here. Additional details of the thermometer coded attenuator device will now be further discussed with reference to FIG. 2.

In the example embodiment of FIG. 2 provides a thermometer coded attenuator device that operates linear in dB, and has a control interface that is 100% digital. Alternative embodiments may use any other suitable control scheme such as, for example, a flash analog-to-digital converter in the control path. In such a configuration, the control signal is an analog voltage, but can be converted to linear in dB digital signals with appropriately weighted comparators. As is known, linear in dB is a desirable operating behavior.

In the embodiment shown in FIG. 2, it is achieved by taking an N-bit binary digital control word, and using digital logic to convert it to $2^{N-1}$ control lines that are thermometer coded to control the actual attenuator network, and at very low power. The N-to-M binary-to-thermometer code converter carries out this conversion, and it truth table is shown in Table 1.

TABLE 1

| Binary (N: 0) | Thermometer (M: 0) | $R_{eff}$ |
|---|---|---|
| 0 . . . 0000 | 0 . . . 00000000 | R0 |
| 0 . . . 0001 | 0 . . . 00000001 | R0//R1 |
| 0 . . . 0010 | 0 . . . 00000011 | R0//R1//R2 |
| 0 . . . 0011 | 0 . . . 00000111 | R0//R1//R2//R3 |
| 0 . . . 0100 | 0 . . . 00001111 | R0//R1//R2//R3//R4 |
| 0 . . . 0101 | 0 . . . 00011111 | . |
| 0 . . . 0110 | 0 . . . 00111111 | . |
| 0 . . . 0111 | 0 . . . 01111111 | . |
| 0 . . . 1000 | 0 . . . 11111111 | . |
| . | . | . |
| 1 . . . 1111 | 1 . . . 111111111 | All R's in parallel |

Thus, M equals $2^{N-1}$, and the gain equals $R_F/R_{eff}$. Note that the signal path of the analog signal to be attenuated (i.e., analog signal path) is thermometer coded. Further note that the signal path of the control signal that provides the desired level of attenuation (i.e., control signal path) is thermometer coded. Other control code schemes can be used, and the present invention is not intended to be limited to thermometer coded control. For instance, weighted control codes (analog or digital) can be used, if so desired. In any such cases, and as can be further seen, the delay or phase shift on the analog signal path between nodes A and B of the thermometer coded attenuator network is constant.

Port 1 can be driven, for example, either by a low impedance node (i.e., without the optional port matching network) or by a source having an output impedance that is sufficiently matched by optional port matching network. As previously explained, the low impedance node B eliminates the in-band pole, which can cause gain dependent phase and amplitude characteristics over frequency.

The switching devices $Q_1$ through $Q_M$ (e.g., FETs or other suitable switching devices) and impedance devices $R_1$ through $R_M$ (e.g., thin film resistors or other suitable impedance devices) can be implemented with conventional technology. In one example embodiment, the switching and impedance devices are implemented using standard CMOS fabrication methodologies in a system-on chip-configuration, including photolithography patterning, etching, and deposition steps. Any number of fabrication methods can be employed. The size of switching devices $Q_1$ through $Q_M$ can be scaled in proportion to $R_1$ through $R_M$ impedance device values, given consideration of factors such as power densities, attenuation steps, and switching speeds. Further, note that the input and output nodes (nodes A and B) of the thermometer coded attenuator network can be reversed. By keeping the input and output nodes of the thermometer coded attenuator network at low impedance, the impact of parasitic capacitance of the network is minimized.

Methodology

Figure 3:
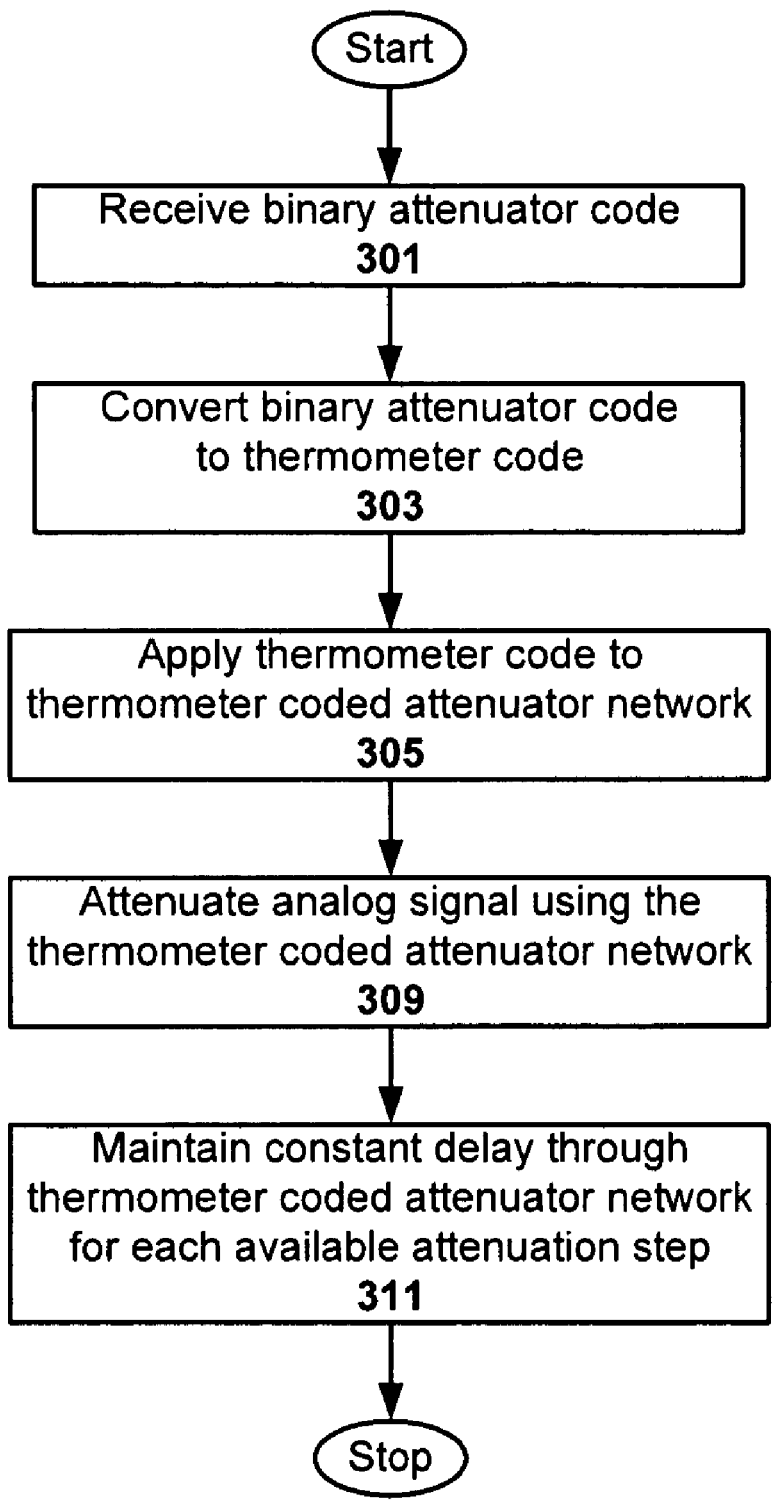
FIG. 3 illustrates method for attenuating a signal using a thermometer coded attenuator device, in accordance with one embodiment of the present invention.

FIG. 3 illustrates method for attenuating a signal using a thermometer coded attenuator device, in accordance with one embodiment of the present invention. The method can be achieved, for instance, by a thermometer coded attenuator structure as shown in FIGS. 1 and 2.

The method of this example embodiment includes receiving 301 a binary attenuator control code, and converting 303 that binary attenuator control code to a thermometer control code. Note that this control code generally corresponds to a desired attention step, and may be generated in any form and applied in any form, depending on the control interface that is desired. As previously explained, the binary to thermo code conversion can be implemented as conventionally done (e.g., static logic gates or programmable logic).

In this example case, the method continues with applying 305 the thermometer control code to thermometer coded attenuator network to provide a desired attenuation step, and attenuating 309 an analog signal using the thermometer coded attenuator network. As will be appreciated, the thermometer control code essentially effects an instant (or close to instant) change in attenuation level of the signal. As previously explained, the thermometer coded attenuator network includes two low impedance ports (input and output ports) operatively coupled to a parallel network of impedance devices, each of which is switchably connected between the two nodes. In some cases, note that the first impedance device may be always in-circuit (i.e., not switched in), if so desired.

The method further includes maintaining 311 a constant delay through the thermometer coded attenuator network for each available attenuation step. This is achieved by eliminating intermediate points of the thermometer coded attenuator network along the analog signal path that get selected or bypassed or otherwise manipulated. Thus, the net delay (or phase shift) of analog signals passing through the thermometer coded attenuator network remains substantially constant, regardless of the attenuation step selected (e.g., variance in signal delay across all attenuation steps is 10% or less in some embodiments; variance in signal delay across all attenuation steps is 5% or less in other embodiments; and variance in signal delay across all attenuation steps is 2% or less in still other embodiments). The minor degree of phase shift (if any) will depend on factors such as tolerancing on the components of the thermometer coded attenuator network (e.g., tighter tolerancing provides smaller variance in delay), as well as the symmetry of the thermometer coded attenuator network parallel network relative to the input and output ports (e.g., variation in signal path geometries through the parallel structure is minimized).

With respect to symmetry, in one example embodiment, the input and output ports are positioned across from one another on a common plane or line that effectively divides the parallel network of impedance components in half (e.g., center line of the parallel structure, such that the same number of impedance components is above and below the line). In such as case, the distance from the impedance element at one end of the parallel network to the center line is the same as the distance from the impedance element at the other end of the parallel network to the center line. This would mean that the analog signal path through either of these two outer parallel paths is the same physical distance. The shape and geometry of each parallel signal path between the input and output nodes can also be the same, to further reduce phase discontinuity.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for attenuating a signal using a thermometer coded attenuator device having a number of attenuator steps, the method comprising:
   applying a control code to a thermometer coded attenuator network to provide a desired attenuation step, the thermometer coded attenuator network having an input port and an output port and a plurality of impedance elements, each impedance element operatively coupled between the input and output ports and in parallel with one another;

attenuating an analog signal using the thermometer coded attenuator network; and maintaining, a constant, signal delay for each available attenuation step.

2. The method of claim 1 further comprising the preliminary steps of:

receiving an attenuator control code having a first form; and converting that attenuator control code to a second control code, wherein the second control code is applied to thermometer coded attenuator network to provide a desired attenuation step.

3. The method of claim 1 wherein the thermometer coded attenuator device has a frequency band of interest, and thermometer coded attenuator network has a low impedance node that forms a pole that is outside the frequency band of interest.

4. The method of claim 1 wherein the method is carried out by a system-on-chip.

5. The method of claim 1 wherein the constant signal delay for each available attenuation step is such that variance in signal delay across all attenuation steps is 5% or less.

6. The method of claim 1 wherein the control code is a thermometer control code.

7. The method of claim 6 further comprising:

receiving a binary attenuator control code; and converting that binary attenuator control code to the thermometer control code.

* * * * *